US006753483B2

(12) United States Patent
Andoh et al.

(10) Patent No.: US 6,753,483 B2
(45) Date of Patent: Jun. 22, 2004

(54) PRINTED CIRCUIT BOARD AND METHOD OF MANUFACTURING THE SAME

(75) Inventors: Daizo Andoh, Osaka (JP); Fumio Echigo, Osaka (JP); Tadashi Nakamura, Osaka (JP); Yasuhiro Nakatani, Osaka (JP); Yoji Ueda, Osaka (JP); Tousaku Nishiyama, Nara (JP); Shozo Ochi, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 112 days.

(21) Appl. No.: 09/879,385

(22) Filed: Jun. 12, 2001

(65) Prior Publication Data

US 2001/0052425 A1 Dec. 20, 2001

(30) Foreign Application Priority Data

Jun. 14, 2000 (JP) .......................... 2000-177936
Apr. 4, 2001 (JP) .......................... 2001-105446

(51) Int. Cl.⁷ .......................... H01R 12/04; H05K 1/11
(52) U.S. Cl. .................. 174/262; 174/263; 174/265
(58) Field of Search .................. 174/262–266, 174/254, 258, 260, 261, 267; 361/792–795, 750; 428/209–210, 901; 29/841–852

(56) References Cited

U.S. PATENT DOCUMENTS

| | | | |
|---|---|---|---|
| 5,346,750 A | | 9/1994 | Hatakeyama et al. |
| 5,484,647 A | * | 1/1996 | Nakatani et al. ............ 428/209 |
| 5,807,626 A | | 9/1998 | Naba |
| 5,888,627 A | * | 3/1999 | Nakatani ..................... 428/209 |
| 6,326,694 B1 | * | 12/2001 | Hatakeyama et al. ........ 257/774 |

FOREIGN PATENT DOCUMENTS

| | | |
|---|---|---|
| JP | 3-219692 | 9/1991 |
| JP | 6-209148 | 7/1994 |
| JP | 6-268345 | 9/1994 |
| JP | 7-115279 | 5/1995 |
| JP | 9-148738 | 6/1997 |
| JP | 10-84186 | 3/1998 |
| JP | 10-265270 | 10/1998 |
| TW | 342577 | 10/1998 |
| TW | 342578 | 10/1998 |
| TW | 370490 | 9/1999 |

* cited by examiner

*Primary Examiner*—David L. Talbott
*Assistant Examiner*—Tuan Dinh
(74) *Attorney, Agent, or Firm*—Merchant & Gould P.C.

(57) ABSTRACT

The present invention provides a printed circuit board, which includes a dielectric substrate having via holes formed in the thickness direction, and a conductor including a conductive filler is filled in the via holes. The dielectric substrate has patterned wiring layers on both surfaces, and the wiring layers are connected electrically with each other by the conductor. The dielectric substrate is made of a glass cloth or a glass nonwoven fabric impregnated with a thermosetting epoxy resin mixed with fine particles, and the conductive filler in the conductor has an average particle diameter larger than that of the fine particles. Accordingly, the printed circuit board has an improved moisture resistance as a whole and also excellent connection reliability and repair resistance. In addition, the dielectric substrate of the printed circuit board has an improved mechanical strength such as flexural rigidity. The present invention also provides a method of manufacturing such a printed circuit board.

11 Claims, 11 Drawing Sheets

PRINTED CIRCUIT BOARD AND METHOD OF MANUFACTURING THE SAME

BACKGROUND OF THE INVENTION

1. Field of the Invention

This invention relates to a printed circuit board that is suitable for high density packaging of various high-performance electronic apparatuses. The printed circuit board has excellent flexural rigidity or moisture absorption and repair resistance. This invention relates to also a method of manufacturing such a printed circuit board.

2. Description of the Related Art

Recently, various electronic elements composing electronic apparatuses have become smaller and thinner since electronic apparatuses have become small, thin, light-weight and better in the performance. Printed circuit boards for packaging these electronic elements also have been developed to provide a high density package.

With a rapid progress in packaging techniques, it is desired to supply circuit boards with a multilayer wiring structure at a low cost. Such a circuit board can be manufactured by mounting bare chips of a semiconductor device such as LSI directly at a high density, and it can correspond to a high-speed signal processing circuit. Such a multilayer circuit board is required to have high reliability in electric connection between wiring patterns of plural layers formed with a minute wiring pitch and also excellent high frequency property, and is required to have high reliability in a connection with a semiconductor bare chip.

For satisfying this requirement, a resin multilayer circuit board having an any-layer IVH structure is proposed in JP-A-6-268345. In this reference, a copper-plated conductor on a through-hole inner wall, which mainly has been used for interlayer connection in a conventional multilayer circuit board, is replaced by filling of a conductor in a interstitial via hole (IVH) and at the same time, the IVH can be formed immediate below an element land or between arbitrary layers, so that substrate size can be decreased and a high density packaging can be provided. FIGS. 12A–12G show a method of manufacturing such a printed circuit board. First, as shown in FIG. 12A, mold-releasing films 401 made of polyester or the like are laminated on both surfaces of a porous substrate 402 such as an aramid epoxy pre-preg prepared by impregnating an aramid nonwoven fabric with a thermosetting epoxy resin. Next, as shown in FIG. 12B, via holes 403 are formed at predetermined positions of the porous substrate 402 by laser beam machining. Subsequently as shown in FIG. 12C, a conductive paste 404 is filled in the via holes 403. In this step, the porous substrate 402 with the via holes 403 is placed on a table of a screen printer, and the conductive paste 404 is directly printed on the mold-releasing film 401. The mold-releasing films 401 on the printing surface function as printing masks and prevent contamination of the surface of the porous substrate 402. Next, the mold-releasing films 401 are peeled off from the surfaces of the porous substrate 402, and then, metal foils 405 e.g., copper foils, are adhered to the surfaces of the porous substrate 402. By applying heat and pressure in this condition, the porous substrate 402 is compressed and thinned as shown in FIG. 12D. At that time, the conductive paste 404 in the via holes 403 also is compressed and binder ingredients contained in the conductive paste is extruded to strengthen bonding among the conductive ingredients and also between the conductive ingredients and metal foils 405. As a result, the conductive substance in the conductive paste 404 is condensed and the layers are connected electrically with each other. Subsequently, the conductive paste 404 and the thermosetting resin composing the porous substrate 402 are cured. The metal foils 405 are etched selectively to have a predetermined pattern so that a double-sided circuit board as shown in FIG. 12E is provided. Further, as shown in FIG. 12F, porous substrates 406 and metal foils 407 are stuck to the surfaces of the double-sided circuit board by using a conductive paste 408. After applying heat and pressure, as shown in FIG. 12G, the metal foils 407 are etched to have a predetermined pattern, so that a multilayer circuit board is obtained.

Resin multilayer substrates formed by using such substrates for forming circuits have been used for many electronic apparatuses because they have low coefficient of expansion, low dielectric constant, and light-weight.

However, a resin multilayer circuit board having the above-mentioned any-layer IVH structure has a core of an aramid nonwoven fabric, and a dielectric substrate is composed of a homogeneous mixture of an epoxy resin and aramid nonwoven fabric fibers. Such a dielectric substrate having a core of aramid nonwoven fabric has a coefficient of thermal expansion (CTE) of about 100 ppm/° C. in the thickness direction, which is different considerably from CTE (about 17 ppm/° C.) of an interstitial via conductor forming the any-layer IVH structure.

Since the properties of the electronic apparatus may deteriorate to some degree under a severe use condition with abrupt change in temperature, printed circuit boards with higher reliability have been desired.

SUMMARY OF THE INVENTION

In order to solve the above-mentioned problems, a first purpose of the present invention is to provide a printed circuit board and a method of manufacturing the printed circuit board. The printed circuit board has an improved moisture resistance as a whole, so that the connection reliability and repair resistance are improved, and the printed circuit board comprises a dielectric substrate with improved mechanical strength e.g., flexural rigidity.

In addition to the first purpose, a second purpose is to provide a printed circuit board with improved adherence between a wiring pattern and a dielectric substrate and connection reliability between the wiring pattern and the interstitial via conductor, which is achieved by reducing the coefficient of thermal expansion (CTE) of the entire dielectric substrate.

For achieving the purposes, a first printed circuit board according to the present invention comprises a dielectric substrate having via holes formed in the thickness direction in which a conductor containing a conductive filler is filled, and wiring layers are formed on both surfaces of the dielectric substrate so as to have a predetermined pattern and connected electrically with each other by the conductor. The printed circuit board is characterized in that the dielectric substrate is made of a glass cloth or a glass nonwoven fabric impregnated with a thermosetting epoxy resin mixed with fine particles, and the conductive filler contained in the conductor has an average particle diameter larger than that of the fine particles.

A second printed circuit board according to the present invention comprises an internal circuit board and external circuit boards provided on both surfaces of the internal circuit board. The internal circuit board comprises at least two layers of a wiring pattern connected by first interstitial via conductors. The external circuit boards comprise a dielectric material of a glass epoxy resin, second interstitial via conductors compressed into the dielectric substrate to have conductivity and also second wiring patterns arranged on the outermost surfaces of the dielectric substrate. The second printed circuit boards are characterized in that the first wiring pattern on the surfaces of the internal circuit board and the second wiring patterns of the external circuit boards are connected electrically with each other.

A first manufacturing method according to the present invention comprises steps of:

preparing a dielectric substrate of a pre-preg formed by impregnating a glass cloth or a glass nonwoven fabric with a thermosetting epoxy resin mixed with fine particles, coating both surfaces of the dielectric substrate with mold-releasing films and subsequently forming a via hole, filling in the via hole with a conductor containing a conductive filler having an average particle diameter larger than the average diameter of the fine particles, peeling the mold-releasing films and layering metal foils on the surfaces of the dielectric substrate, compressing the dielectric substrate having the metal foils by applying heat and pressure in order to adhere the dielectric substrate and the metal foils and to connect electrically the metal foils with each other, and forming the metal foils to have a predetermined pattern.

A second manufacturing method according to the present invention comprises steps of:

preparing an internal circuit board having at least two layers of first wiring patterns protruding from surfaces of the internal circuit board and being connected with each other by first interstitial via conductors, preparing glass epoxy resin dielectric substrates in a pre-preg stage by forming via holes at arbitrary positions and filling a conductive paste to make a second interstitial via conductor, arranging the glass epoxy resin dielectric substrates on both surfaces of the internal circuit board, arranging copper foils on outer surfaces of the respective glass epoxy resin dielectric substrates, applying heat and pressure from outside of the two copper foils the internal circuit board and the glass epoxy resin dielectric substrates in a pre-preg stage so as to force the protruding wiring patterns of the internal circuit board into the glass epoxy resin dielectric substrate in a pre-preg stage and at the same time to compress the conductive paste provided to the glass epoxy resin dielectric substrates for connecting electrically the outermost copper foils and the first wiring patterns in the internal circuit board, and subsequently etching the copper foils selectively to form second wiring patterns and so as to configure external circuit boards.

DETAILED DESCRIPTION OF THE INVENTION

Figure 1A:
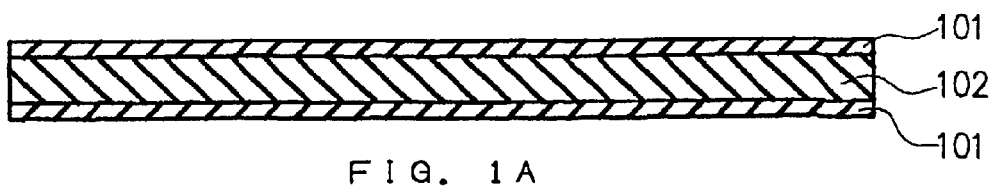
FIGS. 1A–1F are cross-sectional views to show steps of manufacturing a printed circuit board in Example 1 of the present invention.

A first embodiment of the present invention provides a printed circuit board having excellent connection reliability and repair resistance by improving moisture resistance of the printed circuit board as a whole, and the printed circuit board comprises a dielectric substrate with improved mechanical strength such as flexural rigidity When an inorganic filler is mixed with an epoxy resin composing the dielectric substrate, melting viscosity of the epoxy resin is raised. This will control resin flow occurring at an interface between the dielectric substrate and a metal foil at the time of applying heat and pressure, and prevent the epoxy resin from entering the interface between the metal foil and the conductor. As a result, the conductor is provided with sufficient compression and this leads to stable connection reliability.

When the inorganic filler has an average particle diameter smaller than that of the conductive filler, dispersion of the conductive filler during application of heat and pressure is controlled. As a result, the conductor is provided with sufficient compression, and stable connection reliability is obtained. Preferably, the average particle diameter of the inorganic filler is 10% to 50% of the average particle diameter of the conductive filler.

The conductive filler can be a powder of a metal such as gold, silver, copper, aluminum or the like. When the via hole diameter is about 50 $\mu$m, the conductive filler preferably has an average particle diameter of about 5 $\mu$m. Preferably, the conductive filler will have an average particle diameter ranging from about 1 $\mu$m to about 3 $\mu$m for a via hole having a diameter of about 30 $\mu$m.

When the inorganic filler is at least one powder selected from those of $SiO_2$, $TiO_2$, $Al_2O_3$, MgO, SiC and AlN, thus obtained printed circuit board will have further improved mechanical strength including flexural rigidity.

When a content of the inorganic filler ranges from 25 vol. % to 45 vol. %, the melting viscosity is maintained and sufficient compression is applied to the conductor. When the content of the inorganic filler is less than 25 vol. %, sufficient melting viscosity may not be obtained and excessive resin flow may occur. When the content exceeds 45 vol. %, fluidity of the epoxy resin may deteriorate and the conductor cannot be applied with sufficient compression while the adherence is lowered as well. Preferably, the content of the inorganic filler ranges from 35 vol. % to 40 vol. %.

When thickness of the dielectric substrate is smaller than a diameter of via holes formed in the thickness direction of the dielectric substrate, tapering at the time of formation of the via holes by using a laser beam machine or the like can be controlled, and thus, a thin and light-weight printed circuit board can be provided while the rigidity is maintained. Since the conductor will be compressed easily as the dielectric substrate is thinner (the compression rate is raised since the conductor becomes relatively thicker by the thickness of the mold-releasing films), the dielectric substrate is preferably 50 $\mu$m to 100 $\mu$m in thickness when each via hole has a diameter ranging from 100 $\mu$m to 200 $\mu$m.

When the dielectric substrate in a pre-preg stage comprises a void, the dielectric substrate will be compressed by the void volume upon application of heat and pressure. As a result, the conductor is applied with sufficient compression and stable connection resistance is obtained.

A coefficient of thermal expansion (CTE) in the thickness direction of a conductor filled in via holes formed in the thickness direction of the dielectric substrate substantially is equal to the CTE in the thickness direction of the dielectric substrate, distortion caused by a gap in the CTEs can be controlled and stable connection reliability is obtainable even under a circumstance to cause an abrupt change in temperature. Preferably, the CTE of the conductor in the thickness direction is equal to the CTE of the dielectric substrate in the thickness direction.

The printed circuit board can be a multilayer printed circuit board comprising a laminate of printed circuit boards according to the present invention. Accordingly, the present invention can provide a multilayer printed circuit board having reliable via hole connection.

When a conductor filled in via holes formed in the thickness direction of the dielectric substrate is substantially uniform in the thickness in the multilayer printed circuit board of the present invention, an excellent impedance property is obtained, and a printed circuit board suitable for a high frequency circuit board can be provided.

In a case where the conductor is a conductive paste, resin ingredients in the conductive paste will be discharged from the via holes when the conductive paste in the via holes is compressed. As a result, conductive ingredients in the conductive paste are condensed to provide a reliable via hole connection.

By using a laser beam machine, via holes having a minute diameter in accordance with a minute wiring pattern can be formed easily at a high speed.

A first manufacturing method in the present invention can provide a double-sided printed circuit board that is excellent in the moisture resistance, connection reliability or repair resistance, and the printed circuit board comprises a dielectric substrate provided with improved mechanical strength such as flexural rigidity.

When the dielectric substrate is thinned after application of heat and pressure, the conductor can be applied with sufficient compression. For controlling resin flow, it is preferable that the dielectric substrate is thinned by 10% to 15% after application of heat and pressure.

When the conductor filled in the via holes formed in the thickness direction of the dielectric substrate is thinned after the application of heat and pressure, the conductive ingredients in the conductor are condensed due to sufficient compression, and this leads to a reliable via hole connection. Preferably, the conductor is thinned by 30% to 40% by the application of heat and pressure.

When the dielectric substrate after being applied with heat and pressure is substantially uniform in thickness in the center and in the periphery, the entire dielectric substrate will be applied with uniform compression at a time of applying heat and pressure, and thus, variation in the connection resistance can be reduced.

Alternatively, the present invention can provide a rigid, thin, and small multilayer printed circuit board that is provided with excellent reliability and that can form a minute wiring pattern to allow a high density package of a subminiature electronic element or the like. A method of manufacturing the printed circuit board comprises two processes. In a first process, a dielectric substrate of a pre-preg is made of either a glass cloth or a glass nonwoven fabric. The glass cloth or glass nonwoven fabric is impregnated with a thermosetting epoxy resin and filled with a conductor. Metal foils are adhered to this dielectric substrate, and the dielectric substrate is compressed by applying heat and pressure, so that wiring layers of the double-sided printed circuit board are embedded in resin layers on the surfaces of the dielectric substrate and all the conductors become substantially uniform in thickness. In a second process, the metal foils are formed to have a predetermined pattern.

Alternatively, the present invention can provide a multilayer printed circuit board with excellent reliability in fewer steps at a low cost, and the printed circuit board allows high density package of subminiature electronic elements or the like. A method to manufacture such a printed circuit board comprises preparing either a glass cloth or a glass nonwoven fabric, producing a dielectric substrate of a pre-preg by impregnating the glass cloth or glass nonwoven fabric with a thermosetting epoxy resin and filling with a conductor, sticking the dielectric substrate integrally on surfaces of the plural double-sided printed circuit boards before compressing by application of heat and pressure. As a result, wiring layers of the double-sided printed circuit board are embedded in resin layers on the surfaces of the dielectric substrate and all the conductors become substantially uniform in thickness.

A second printed circuit board according to the present invention is of a complex type with excellent flexural rigidity and moisture resistance, and this printed circuit board is provided by arranging a glass epoxy resin substrate as an external circuit board having excellent mechanical strength and moisture resistance.

It is preferred that an aramid nonwoven fabric impregnated with a thermosetting epoxy resin is used for a dielectric substrate of an internal circuit board. As a result, a first interstitial via conductor having a minute diameter can be provided to an arbitrary position on the dielectric substrate so as to provide an any-layer IVH structure. This serves to provide a printed circuit board having a high density wiring.

Preferably, the external circuit board is made of glass fibers impregnated with an epoxy resin, and the epoxy resin is mixed with an inorganic filler contained in a range from 30 wt % to 70 wt %, and the inorganic filler is at least one powder of $SiO_2$, $TiO_2$, $Al_2O_3$, $MgO$, $SiC$ and $AlN$, so that the flexural rigidity is improved further and thus, a printed circuit board with good compression property can be obtained.

A second manufacturing method according to the present invention can provide a complex printed circuit board having excellent flexural strength and moisture resistance.

Embodiments of the present invention will be explained further by referring to the drawings.

EXAMPLE 1

FIGS. 1A–1F are cross-sectional views to show steps of a method of manufacturing a double-sided circuit board in Example 1 of the present invention.

Figure 5:
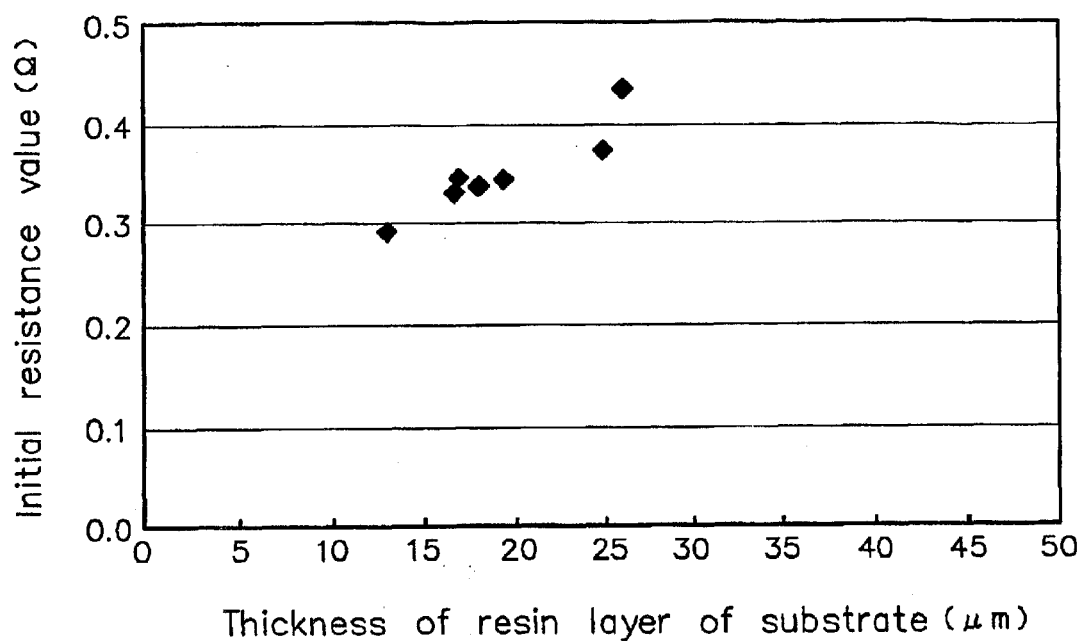
FIG. 5 is a graph to show a relationship between a thickness of a resin layer of the printed circuit board and initial resistance values in Example 1 of the present invention.

First, a dielectric substrate 102 of a glass epoxy pre-preg was prepared by impregnating a glass cloth with a thermosetting epoxy resin comprising 40 vol. % of SiC fine particles having an average diameter of 2 μm. The glass epoxy pre-preg in Example 1 was 130 μm in thickness, since the thickness of the glass cloth was 100 μm and the thickness of each surface resin layer was 15 μm. On both surfaces of the dielectric substrate 102, mold-releasing films 101 (e.g., polyester) were laminated. The lamination was carried out at a temperature about 120° C. As a result, resin layers on the surfaces of the dielectric substrate 102 to which the mold-releasing films 101 were stuck were melted slightly. FIG. 5 is a graph to show the dependence of an initial resistance value on the thickness of the resin layer of the material included in a printed circuit board. Since the initial resistance value is lowered as the resin layer of the material is thinned, the material in Example 1 was determined to be 130 μm in thickness. The mold-releasing films used here were polyethylene terephthalate (PET) 19 μm in thickness. The glass cloth used for the dielectric substrate can be replaced by a glass nonwoven fabric on which resin layers are formed.

The fine particles can be an organic filler and/or an inorganic filler. SiC as the inorganic filler can be replaced by $SiO_2$, $TiO_2$, $Al_2O_3$, MgO or AlN, while the organic filler can include benzoguanamine, polyamide, polyimide, melamine resin, epoxy resin or the like. Alternatively, the organic filler and the inorganic filler can be used as a mixture.

Figure 1B:
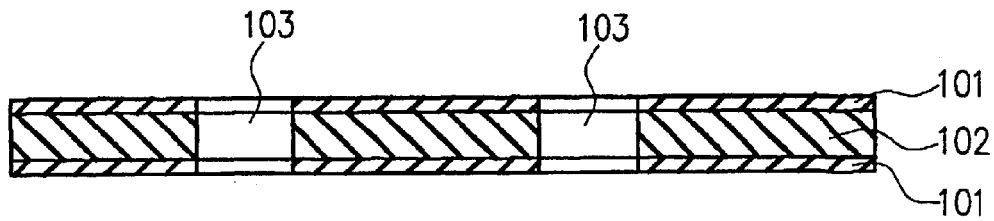

As shown in FIG. 1B, via holes 103 were formed at predetermined positions on the dielectric substrate 102 by a laser processing. The via holes formed by the above-mentioned laser beam machine had a diameter of about 100 μm. The glass epoxy pre-preg comprises 10 vol. % voids, and diameter of the voids was 3 μm.

Figure 1C:
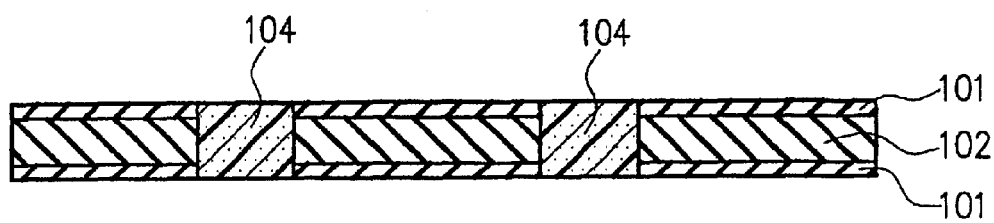

Next, the via holes 103 were filled with a conductive paste 104 as shown in FIG. 1C. A screen printer was used for filling by directly printing the conductive paste 104 on the mold-releasing films 101. At this time, vacuum adsorption was performed via, for example, a porous sheet such as Japanese paper from a surface opposite to the printed surface so that resin ingredients contained in the conductive paste 104 in the via holes 103 were absorbed and thus, a content of the conductive ingredients was increased and concentration of the filled conductive ingredients was raised. The mold-releasing films 101 functioned as printing masks and also the films served to prevent contamination of the surfaces of the dielectric substrate 102. An average particle diameter of the conductive filler in the conductive paste was 5 μm, and this was larger than a diameter of a void and a diameter of the fine particles.

Figure 1D:
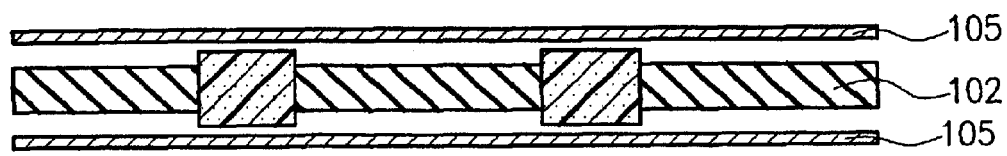

As shown in FIG. 1D, the mold-releasing films 101 were peeled off from the surfaces of the dielectric substrate 102. Then, the surfaces of the dielectric substrate 102 were coated with metal foils 105 such as copper foils before application of heat and pressure. The heat and pressure were applied by a vacuum press. This process was carried out for one hour under a condition of a temperature of 200° C., a pressure of 4.9 MPa, and a vacuum degree of $5.33 \times 10^3$ Pa (40 Torr).

Figure 1E:
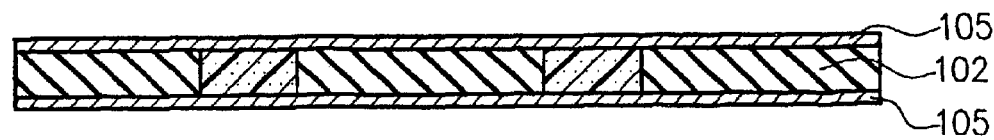

As a result of applying heat and pressure under the condition, the dielectric substrate 102 was compressed as shown in FIG. 1E. The dielectric substrate 102 was thinned to 118 μm at the center and 116 μm in the periphery. The difference in the thickness between the center and the periphery was as small as about 2%, and the compression rate as a whole was about 10%. At this time, the conductive paste 104 in the via holes 103 were compressed as well, and thus, binder ingredients contained in the conductive paste were extruded. This strengthens bonding among the conductive ingredients and also between the conductive ingredients and the metal foils 105, and the conductive substance in the conductive paste 104 was condensed. The compression rate of the conductor at this time was $(168-117) \times 100/168 = 30.4\%$. Subsequently, the thermosetting resin composing the dielectric substrate 102 was cured together with the conductive paste 104 by applying heat and pressure. This process was carried out for one hour under a condition of a temperature of 200° C., a pressure of 4.9 MPa, and a vacuum degree of $5.33 \times 10^3$ Pa (40 Torr).

Figure 1F:
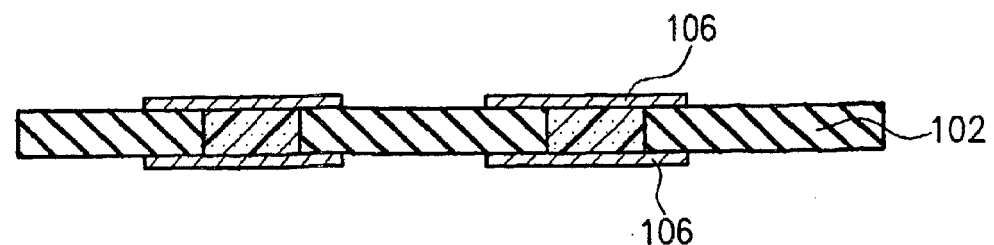

Finally, both the wiring layers 106 on the front and back surfaces of the dielectric substrate 102 were connected electrically with each other by selectively etching the metal foils 105 in a predetermined pattern as shown in FIG. 1F, so that a double-sided circuit board was obtained.

An average particle diameter of a conductive powder contained in the conductive paste was 5 μm in Example 1, and an average particle diameter of the inorganic filler was 40% of that of the conductive powder. The CTE of the conductor in a thickness direction was about 30 ppm/° C. while the CTE of the dielectric substrate in the thickness direction was about 20 ppm/° C., i.e., CTE of the conductor was larger than that of the dielectric substrate.

Since the filler has an average diameter larger than that of the fine particles, the fine particles can prevent dispersion of the conductive filler in the resin layers on the surfaces of the dielectric substrate during application of heat and pressure. This helps to apply sufficient compression to the conductor, resulting in a stable connection reliability and excellent moisture absorption. This can prevent peeling of the conductor and the wiring layers, which is caused by abrupt change in temperature at a time of solder dipping or repairing.

Figure 4A:
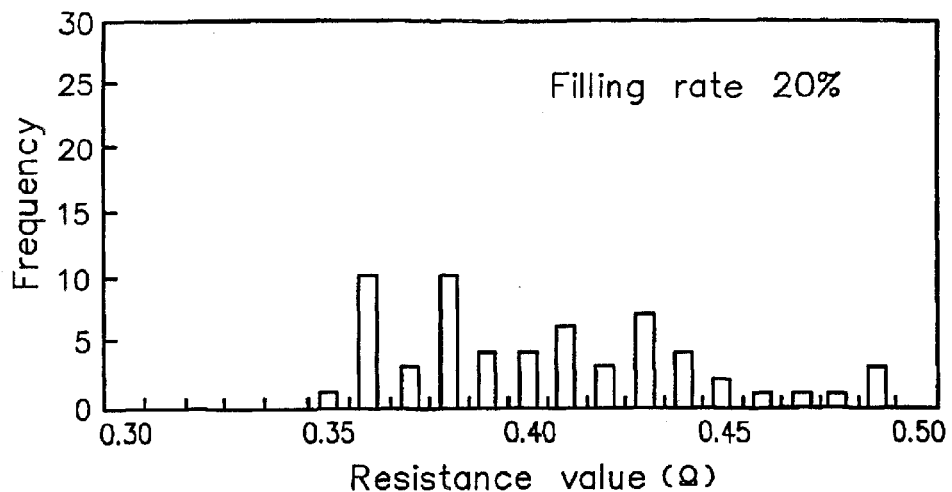
FIGS. 4A–4C are distribution charts to show variations in resistance values of the printed circuit board in Example 1 of the present invention.
Figure 4B:
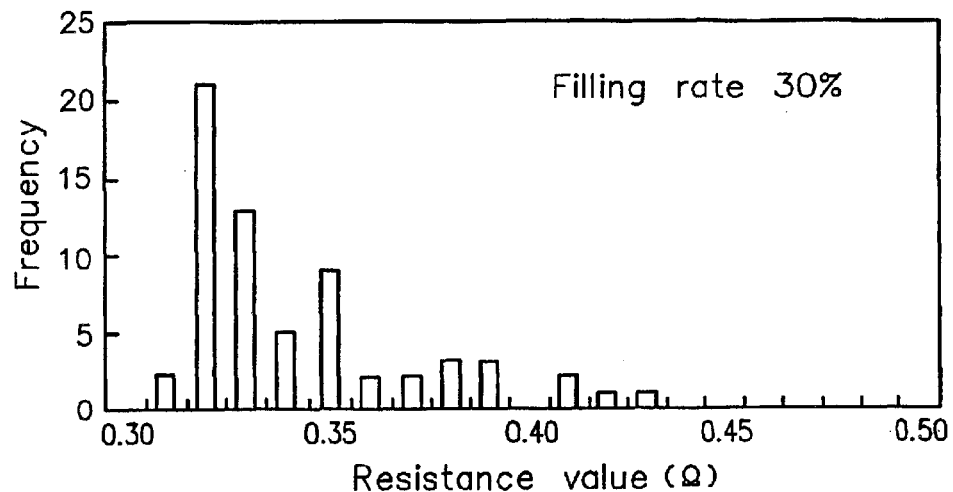
Figure 4C:
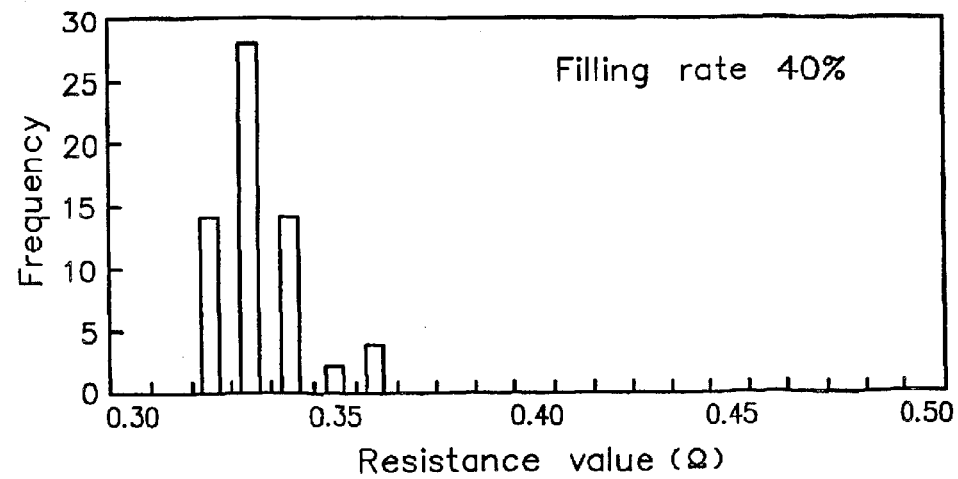

Furthermore, the epoxy resin composing the dielectric substrate was mixed with 40 vol. % of SiC as an inorganic filler having an average diameter of 2 μm. FIGS. 4A–4C are distribution diagrams to show variation in resistance values of printed circuit boards. As shown in FIG. 4A, the resistance values were varied when the filling amount was 20 vol. %. On the other hands, FIG. 4B shows that the filler of 30 vol. % caused some variation though the distribution was substantially concentrated. The distribution was concentrated further when the filling amount was 40 vol. % as shown in FIG. 4C.

When the content of the fine particle ranges from 25 vol. % to 45 vol. %, the melting viscosity is maintained while the conductor is applied with sufficient compression, and thus, stable connection reliability is obtained. When the content is less than 25 vol. %, sufficient melting viscosity is not obtained. As a result, excessive resin flow occurs in the resin layers on the surfaces of the dielectric substrate and the conductive filler contained in the conductor is dispersed, so that pressure applied to the conductor will be dispersed as well. Moreover, the dispersed conductive filler can migrate to cause insulation failure. When the content exceeds 45 vol. %, sufficient epoxy resin to provide a desired adherence may not be obtained, and the fluidity of the epoxy resin deteriorates to apply insufficient compression to the conductor. It is more preferable that the content of the fine particle ranges from 30 vol. % to 35 vol. %.

Accordingly, Example 1 can improve mechanical strengths such as flexural rigidity of a dielectric substrate and provide a printed circuit board having excellent connection reliability and moisture absorption.

EXAMPLE 2

FIGS. 2A–2D are cross-sectional views to indicate steps of a method of manufacturing a double-sided circuit board in Example 2 of the present invention.

First, a core substrate 201 was prepared in the same process as indicated in FIG. 1F of Example 1.

Figure 2A:
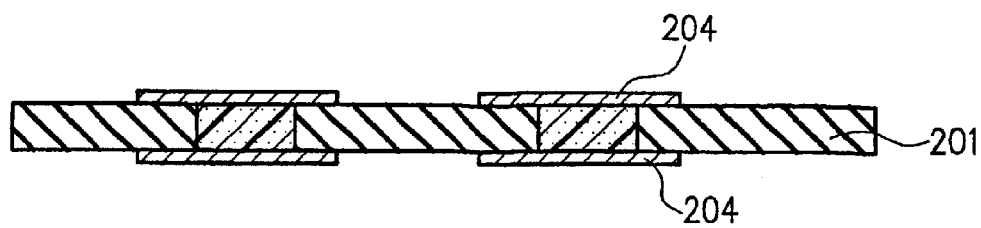
FIGS. 2A–2D are cross-sectional views to show steps of manufacturing a printed circuit board in Example 2 of the present invention.
Figure 2B:
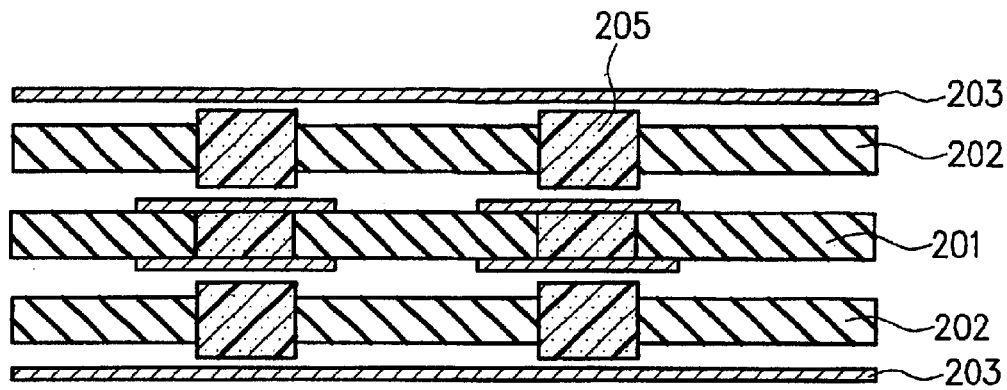

Next, as shown in FIG. 2B, dielectric substrates 202 shown in FIG. 1C were layered on the both surfaces of the core substrate 201, and metal foils 203 were layered further before application of heat and pressure. The heat and pressure were applied by vacuum heat press. This process was carried out for one hour under a condition of a temperature of 200° C., a pressure of 4.9 MPa, and a vacuum degree of $5.33 \times 10_3$ Pa (40 Torr).

The dielectric substrates 202 were compressed and thinned by the application of heat and pressure, and the wiring layers 204 were embedded in the dielectric substrates 202. The conductive paste 205 also was compressed, and at that time, binder ingredients contained in the conductive paste were extruded. This provided strong bonding among the conductive ingredients and also between the conductive ingredients and the metal foils 203, and thus, the conductive substance in the conductive paste 205 was condensed. Subsequently, the conductive paste 205 and the thermosetting resin composing the dielectric substrates 202 were cured.

Figure 2C:
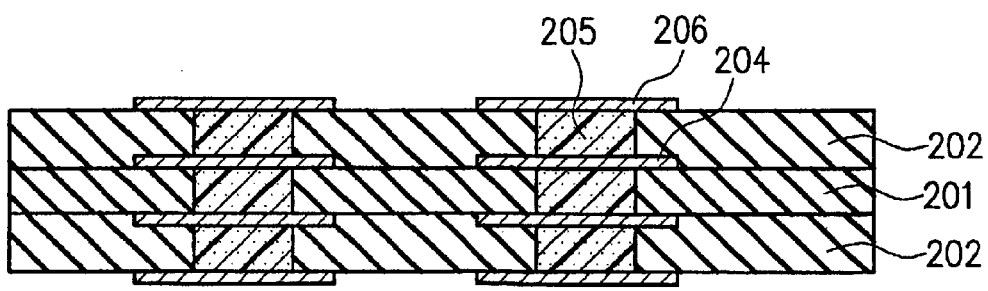

Next, as shown in FIG. 2C, the metal foils 203 were etched selectively to have a predetermined pattern, so that the wiring layers 204 and 206 were connected electrically to provide a completed four-layered circuit board.

Figure 2D:
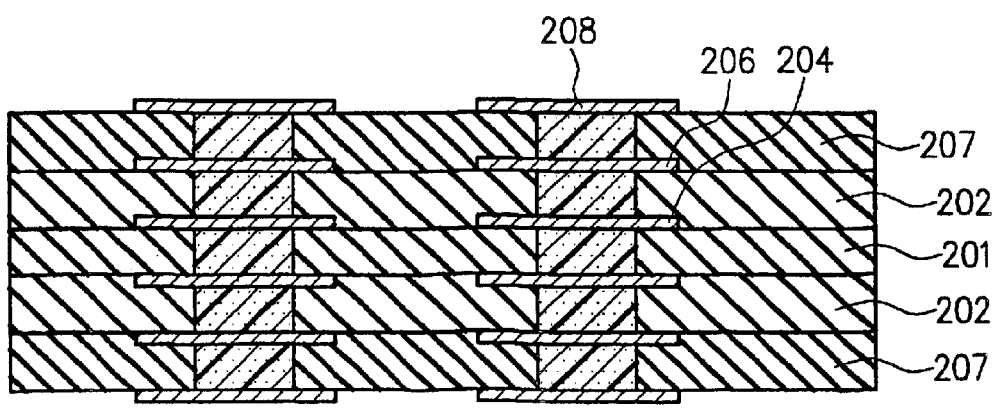

In the last step shown in FIG. 2D, dielectric substrates 207 were layered on both surfaces of the four-layered circuit board. The wiring layer 206 was connected electrically with the wiring layer 208 through steps as shown in FIGS. 2B and 2C, so that a six-layered circuit board was obtained.

All layers of the six-layered circuit board according to Example 2 were composed of glass epoxy, and laminated integrally. Therefore, compact wiring patterns to allow high density packaging of elements such as a subminiature electronic element can be formed, and the printed circuit board has excellent rigidity, moisture absorption, and repair property.

EXAMPLE 3

Figure 3A:
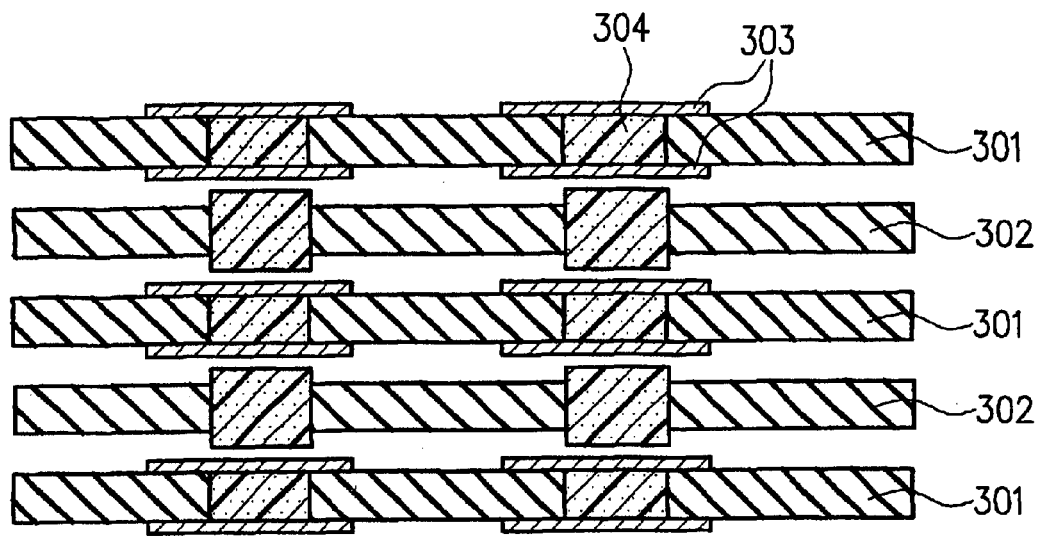
FIGS. 3A and 3B are cross-sectional views to show steps of manufacturing a printed circuit board in Example 3 of the present invention.
Figure 3B:
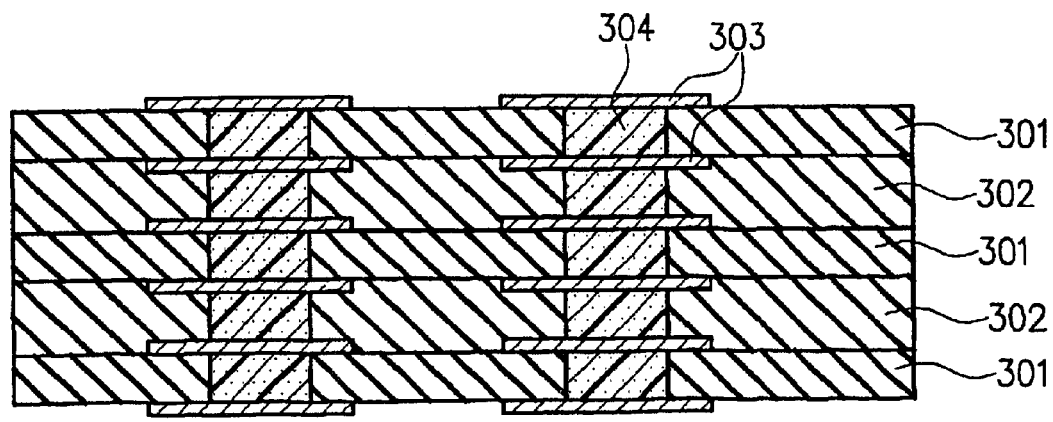

FIGS. 3A and 3B are cross-sectional views to show steps in a method of manufacturing a double-sided printed circuit board according to Example 3 of the present invention.

As shown in FIG. 3A, three core substrates 301 provided by the step shown in FIG. 1F, and two dielectric substrates 302 provided by the step shown in FIG. 1C were prepared. The respective dielectric substrates 302 were inserted between the core substrates 301 to form a laminate before application of heat and pressure. The heat and pressure were applied by a vacuum heat press. This process was carried out for one hour under a condition of a temperature of 200° C., a pressure of 4.9 MPa, and a vacuum degree of $5.33 \times 10^3$ Pa (40 Torr).

As a result of application of heat and pressure, the dielectric substrates 302 were compressed and thinned as shown in FIG. 3B, and the wiring layers 303 were embedded in the dielectric substrates 302. The conductive paste 304 also was compressed at this time, and the binder ingredients contained in the conductive paste were extruded to strengthen bonding among the conductive ingredients and also between the conductive ingredients and the wiring layers 303, and thus, the conductive substance in the conductive paste 304 was condensed. Later, the conductive paste 304 and the thermosetting resin composing the dielectric substrates 302 were cured by the application of heat and pressure, and the wiring layers 303 were connected electrically, so that a six-layered circuit board was obtained.

All layers of a six-layered circuit board according to Example 3 are composed of glass epoxy, and laminated integrally. Therefore, compact wiring patterns to allow high density packaging of elements such as a subminiature electronic element can be formed with fewer steps at a low cost, and the printed circuit board has excellent rigidity, moisture absorption, and repair property.

EXAMPLE 4

Figure 6:
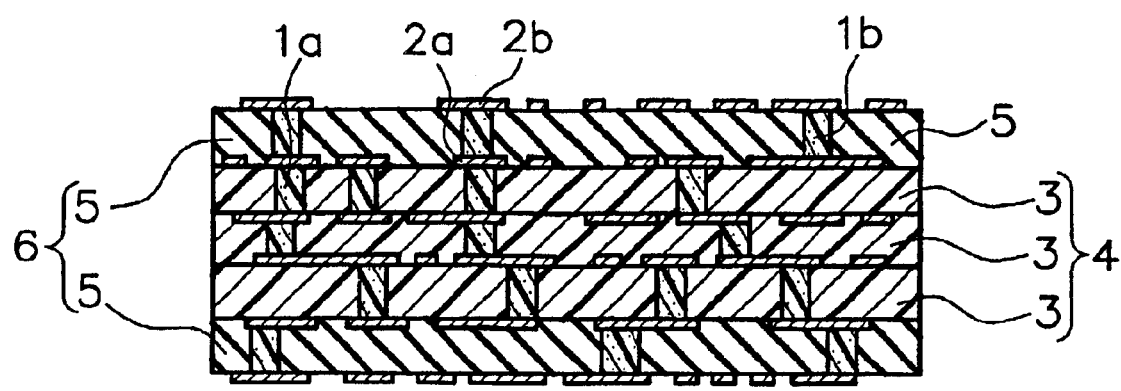
FIG. 6 is a cross sectional view to show a structure of a printed circuit board in Example 4 of the present invention.

FIG. 6 shows a printed circuit board in Example 4 of the present invention. An external circuit board 6 comprising dielectric substrates 5 of a glass epoxy resin was manufactured in accordance with Example 1. An internal circuit board 4 in this example has a three-layered any-layer IVH structure having dielectric substrates 3 of an aramid epoxy resin in which a first interstitial via conductor 1a and a first wiring pattern 2a were formed. On both surfaces of the internal circuit board 4, the external circuit boards 6 comprising dielectric substrates 5 of a glass epoxy resin having a second wiring pattern 2 on outermost layers connected with the first wiring pattern 2a of the internal circuit board 4 through a second interstitial via conductor 1b were arranged. A conductive paste filled in the via holes was compressed to be the second interstitial via conductor 1b when the external circuit boards 6 were laminated on the internal circuit board 4. The thus formed second interstitial via conductor 1b had sufficient conductivity.

EXAMPLE 5

Figure 7:
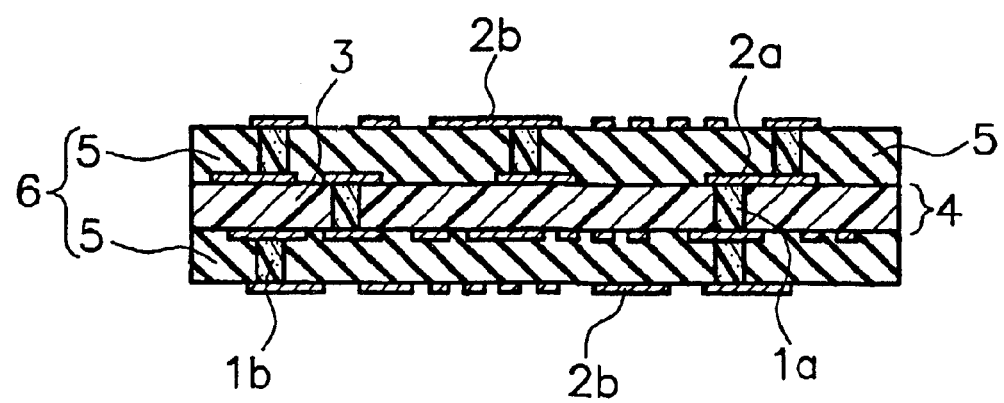
FIG. 7 is a cross sectional view to show a structure of a printed circuit board in Example 5 of the present invention.

FIG. 7 shows a printed circuit board in Example 5 of the present invention. The printed circuit board is same as that of Example 4 except that the internal circuit board 4 is a double-sided circuit board comprising a dielectric substrate 3 of an aramid epoxy resin. The printed circuit board had a structure similar to that of Example 1 except for the above-identified matter.

EXAMPLE 6

In the following, a method of manufacturing a printed circuit board in Example 6 will be described by referring to FIGS. 8A–8C where some of the elements common to those of FIG. 6.

Figure 8A:
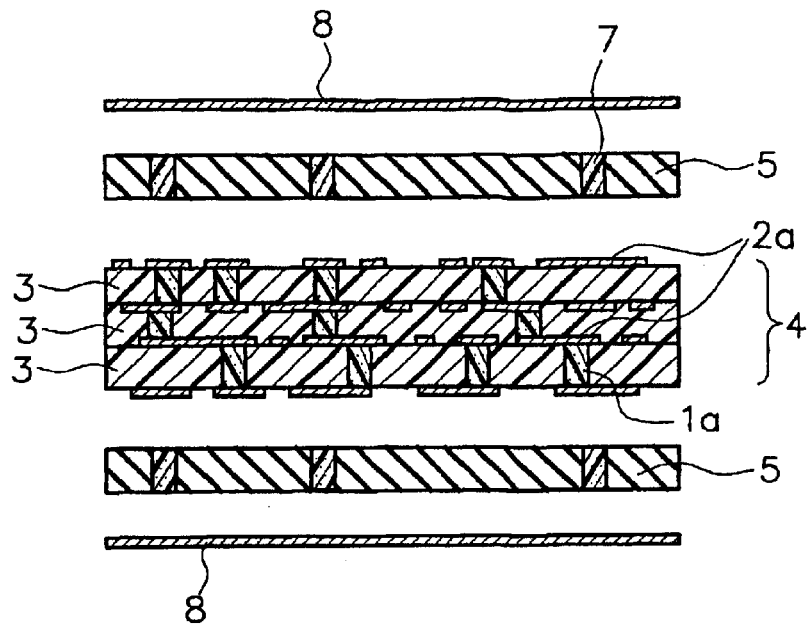
FIGS. 8A–8C are cross-sectional views to show steps of manufacturing a printed circuit board in Example 6 of the present invention.

FIG. 8A shows a structure of a printed circuit board according to Example 6. An internal circuit board 4 has an any-layer IVH structure in which first wiring patterns 2a are connected with each other by a first interstitial via conductor 1a. On both surfaces of the internal circuit board 4, dielectric substrates 5 comprising a glass epoxy resin in a pre-preg stage are arranged, and the dielectric substrates 5 are filled with a conductive paste 7 by printing or the like. The conductive paste 7 comprises a conductive powder such as silver or copper as a main ingredient for forming a second interstitial via conductor 1b. Copper foils 8 are arranged further on the surfaces.

Figure 8B:
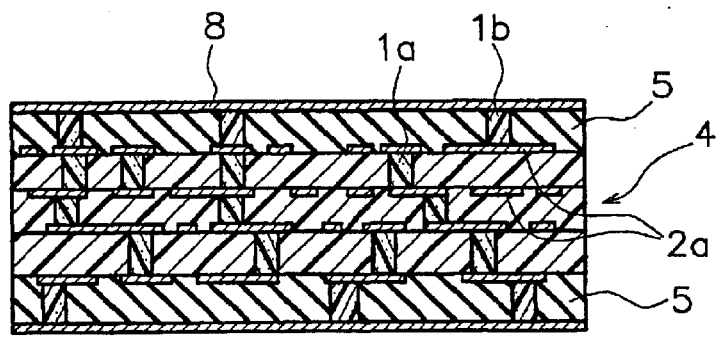

Subsequently, as shown in FIG. 8B, the entire body is compressed and laminated by applying heat and pressure from both sides by using a press such as a mold. As a result, the first wiring patterns 2a formed in the outermost layers of the internal circuit board 4 are forced into the surface layers of the glass epoxy resin dielectric substrates 5 that have been in a pre-preg stage before the compression, and at the same time, the conductive paste 7 provided in the glass epoxy resin dielectric substrates 5 is compressed to have conductivity so that the conductive paste 7 becomes the second interstitial via conductor 1b to connect the first wiring patterns 2a and the copper foils 8 electrically. At this time, the copper foils 8 are adhered strongly through the epoxy resin layers flowing on the surfaces of the dielectric substrates 5.

Figure 8C:
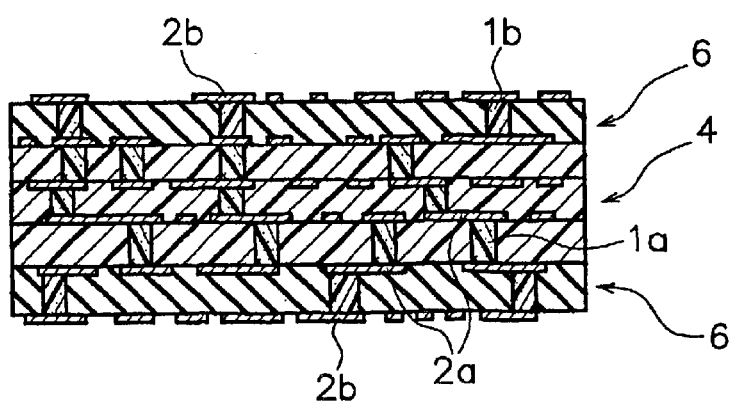

Next, as shown in FIG. 8C, the copper foils 8 as outermost layers adhered to the surfaces are patterned selectively by an ordinary photolithography in order to form second wiring patterns 2b, so that the first wiring patterns 2a and the second wiring patterns 2b are connected to each other through the first interstitial via conductor 1a and the second interstitial via conductor 1b in order to provide a complex printed circuit board having a multilayer structure.

Figure 9A:
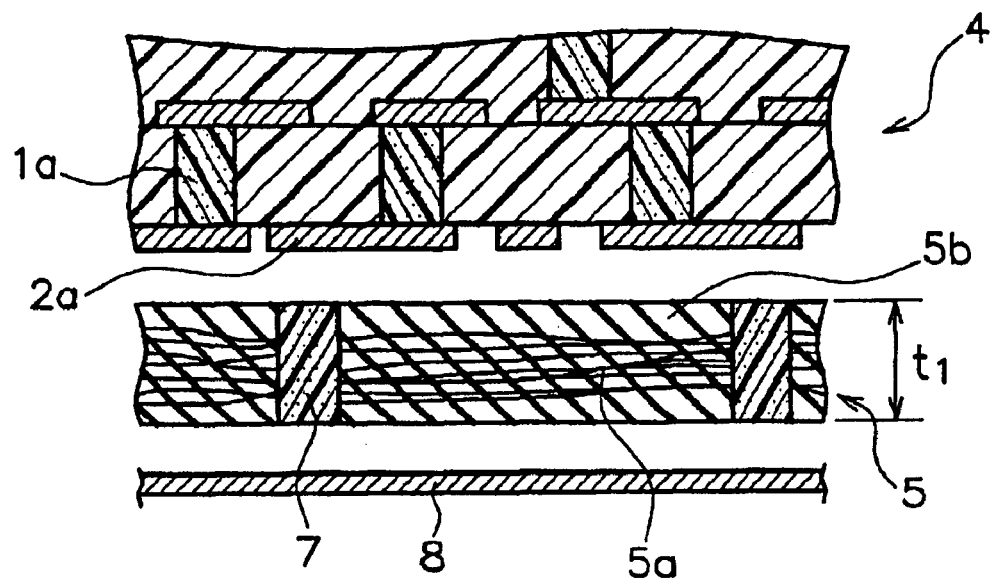
FIGS. 9A and 9B are enlarged views to show parts of the cross-sectional views of FIGS. 8A and 8B.

FIG. 9A is a magnified view of a part of the internal circuit board 4 concerning a manufacturing method shown in FIG. 8A, in which a dielectric substrate 5 and a copper foil 8 are laminated. The dielectric substrate 5 shown in FIG. 9A comprises a glass epoxy resin in a pre-preg stage, in which glass fibers 5a aggregate in the inner layer of the dielectric substrate 5 and epoxy resin 5b is retained on the surface of the dielectric substrate 5.

Therefore, the dielectric substrate 5, the internal circuit board 4 and the copper foil 8 are arranged as shown in FIG. 9A before applying heat and pressure from both sides, so that the wiring pattern 2a of the internal circuit board 4 is forced into the epoxy resin 5b retained on the surface of the dielectric substrate 5.

At the same time, the conductive paste 7 filled in the via holes in the dielectric substrate 5 is compressed to decrease the initial thickness of $t_1$ to $t_2$, so that a second interstitial via conductor 1b having a low resistance is formed to allow electrical connection between the copper foil 8 and the first wiring pattern 2a of the internal circuit board 4.

Figure 9B:
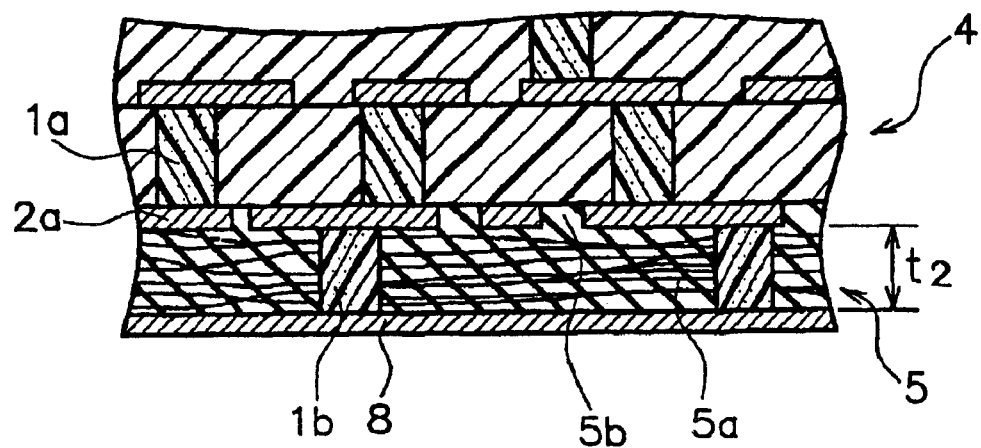
Figure 10:
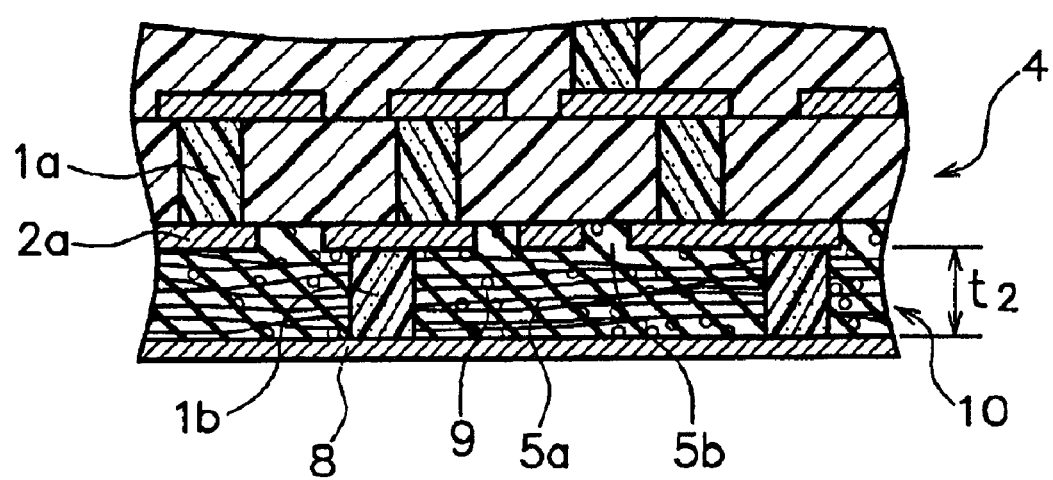
FIG. 10 is a partially enlarged cross-sectional view to show that an inorganic filler is mixed with a dielectric substrate shown in FIG. 9B.

FIG. 10 shows an external circuit board 10 in which a dielectric substrate similar to that of FIGS. 9A and 9B comprises a glass epoxy resin mixed with 30 wt % to 70 wt % of at least one inorganic filler 9 comprising powders of $SiO_2$, $TiO_2$, $Al_2O_3$, MgO, SiC, AlN or the like. Addition of the inorganic filler 9 raises the viscosity of the epoxy resin, and this can prevent the dielectric epoxy resin from entering the interface between the first wiring pattern 2a or the copper foil 8 and the conductive paste. As a result, the electric connection reliability is improved, and the mechanical strength of the printed circuit board can be improved. The conductive paste is applied with heat and pressure to be the second wiring pattern 1b.

Since the CTE direction of the dielectric substrate in the thickness can be decreased to a range from 20 ppm to 30 ppm by mixing the inorganic filler, the value approaches the CTE of an interstitial via conductor (about 17 ppm), and this improves connection reliability between the wiring pattern and the interstitial via conductor. Furthermore, a coefficient of thermal expansion in the face direction of the printed circuit board can be decreased as well, and thus, the connection reliability can be improved at a time of packaging a semiconductor chip.

Figure 11:
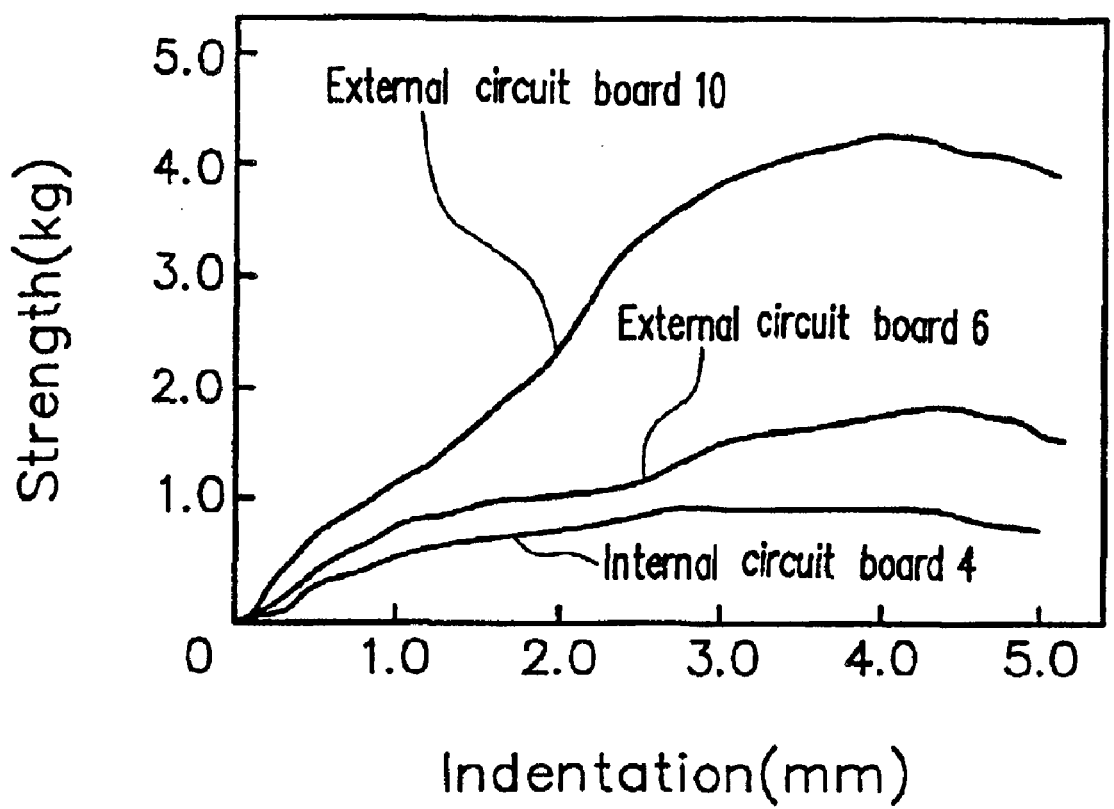
FIG. 11 is a graph to show mechanical strength characteristics of an internal circuit board and of external circuit boards composing the printed circuit board in Example 6 of the present invention.
Figure 12A:
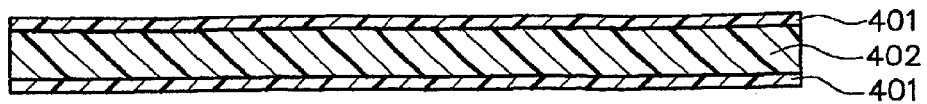
FIGS. 12A–12G are cross-sectional views to show steps of manufacturing a conventional printed circuit board.
Figure 12B:
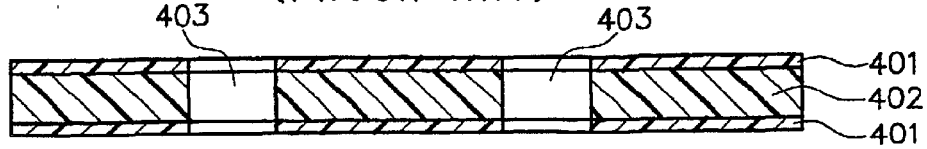
Figure 12C:
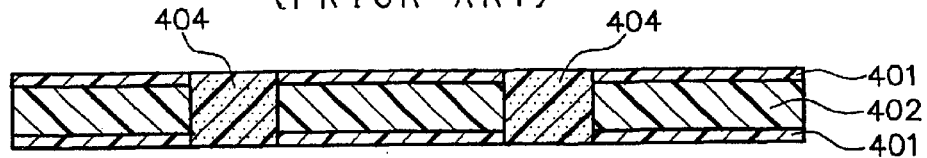
Figure 12D:
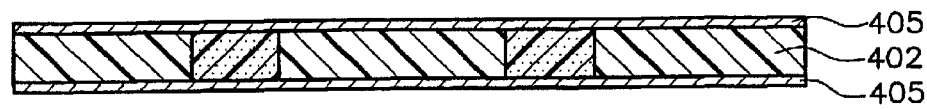
Figure 12E:
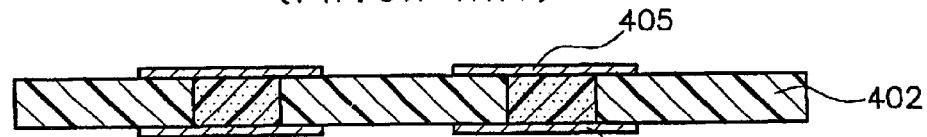
Figure 12F:
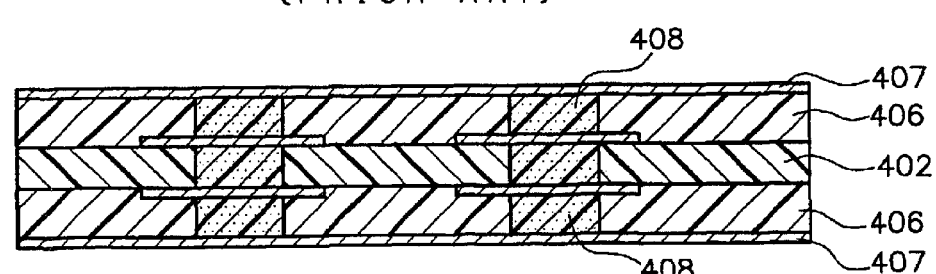
Figure 12G:
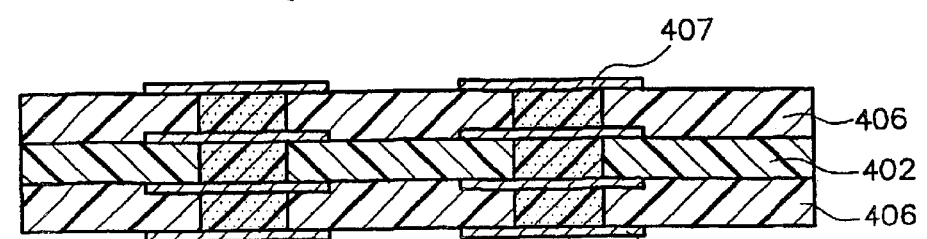

FIG. 11 is a graph to show a measurement result concerning flexural rigidities of an internal circuit board 4, an external circuit board 6 and an external circuit board 10 comprising an inorganic filler of a printed circuit board according to the present invention. The external circuit board 6 made of a glass epoxy resin has a flexural rigidity higher than that of the internal circuit board 4 comprising an aramid epoxy resin. The external circuit board 10 additionally comprising an inorganic filler has an even higher flexural rigidity.

A printed circuit board according to the present invention comprises an external circuit board 6 or 10 comprising a glass epoxy resin arranged on both sides of an internal circuit board 4 comprising an aramid epoxy resin. Such a printed circuit board can have excellent packaging reliability for respective electronic elements, and also repair property and moisture resistance for the elements.

The mechanical strength cannot be expected to improve further when the content of the inorganic filler is less than 30 wt %. On the other hand, when the content exceeds 70 wt %, the epoxy resin will have inferior fluidity, and impregnating ability with respect to the glass fibers deteriorates. As a result, it will be difficult to obtain a homogeneous glass epoxy resin dielectric substrate.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, all changes that come within the meaning and range of equivalency of the claims are intended to be embraced therein.

What is claimed is:

1. A printed circuit board comprising a dielectric substrate having a via hole formed in a thickness direction of the dielectric substrate and filled with a conductor containing a conductive filler, the dielectric substrate having wiring layers on both surfaces, and the wiring layers being formed to have a predetermined pattern and connected electrically with each other by the conductor, wherein the dielectric substrate comprises a glass cloth or a glass nonwoven fabric impregnated with a thermosetting resin mixed with fine particles of organic and/or inorganic filler, and the conductive filler in the conductor has an average particle diameter larger than an average diameter of the fine particles, wherein the mixture of the thermosetting resin with the fine particles is dispersed throughout the entire thickness of the glass cloth or the glass nonwoven fabric.

2. The printed circuit board according to claim 1, wherein the fine particles are at least one inorganic filler selected from powders of $SiO_2$, $TiO_2$, $Al_2O_3$, MgO, SiC and AlN.

3. The printed circuit board according to claim 1, wherein the conductor filled in the via hole formed in the thickness direction of the dielectric substrate has a coefficient of thermal expansion larger than a coefficient of thermal expansion of the dielectric substrate in the thickness direction.

4. The printed circuit board according to claim 1, wherein a content of the fine particles ranges from 25 vol. % to 45 vol. %.

5. The printed circuit board according to claim 1, wherein the thickness of the dielectric substrate is smaller than a diameter of the via hole formed in the thickness direction of the dielectric substrate.

6. The printed circuit board according to claim 1, wherein the dielectric substrate in a pre-preg stage comprises a void.

7. The printed circuit board according to claim 1, comprising a single printed circuit board.

8. The printed circuit board according to claim 1, comprising a multilayer printed circuit board of a laminate of a plurality of the printed circuit boards.

9. The printed circuit board according to claim 1, wherein the thermosetting resin includes an epoxy resin.

10. The printed circuit board according to claim 1, wherein the average particle diameter of the fine particles is 10% to 50% of the average particle diameter of the conductive filler.

11. The printed circuit board according to claim 8, wherein the conductor filled in the via hole formed in the thickness direction of the dielectric substrate of the multilayer printed circuit board has a substantially uniform thickness.

* * * * *